(12) United States Patent
Lee

(10) Patent No.: US 7,310,123 B2
(45) Date of Patent: Dec. 18, 2007

(54) LIQUID CRYSTAL DISPLAY MODULE INCLUDING THERMOELECTRIC DEVICE

(75) Inventor: Chul Woo Lee, Gumi-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 658 days.

(21) Appl. No.: 10/972,449

(22) Filed: Oct. 26, 2004

(65) Prior Publication Data

US 2005/0088585 A1   Apr. 28, 2005

(30) Foreign Application Priority Data

Oct. 27, 2003   (KR) ...................... 10-2003-0075001

(51) Int. Cl.
*G02F 1/1335* (2006.01)
(52) U.S. Cl. .......................... 349/61; 349/65
(58) Field of Classification Search ................... 349/61, 349/65
See application file for complete search history.

(56) References Cited

U.S. PATENT DOCUMENTS 5,808,418 A * 9/1998 Pitman et al. ............... 315/115

2005/0088588 A1 * 4/2005 Lee .............................. 349/65

* cited by examiner

*Primary Examiner*—David Nelms
*Assistant Examiner*—David Y. Chung
(74) *Attorney, Agent, or Firm*—McKenna Long & Aldridge LLP

(57) ABSTRACT

A liquid crystal display device includes a backlight unit having a lamp, wherein the lamp includes opposing ends and electrodes at respective ones of the opposing ends; at least one thermoelectric device operably proximate to the lamp; and a liquid crystal (LC) panel over the backlight unit. Each thermoelectric device includes a hot junction disposed near the lamp; a cold junction spaced apart from the hot junction and disposed farther from the lamp than the hot junction; two different thermoelectric materials between the hot and cold junctions, wherein the two different thermoelectric materials are spaced from each other and wherein opposing ends of each of the different thermoelectric materials contact the hot and cold junctions; and first and second wires connected to respective ones of the two different thermoelectric materials.

22 Claims, 6 Drawing Sheets

LIQUID CRYSTAL DISPLAY MODULE INCLUDING THERMOELECTRIC DEVICE

This application claims the benefit of Korean Patent Application No. 2003-0075001, filed on Oct. 27, 2003, which is hereby incorporated by reference for all purposes as if fully set forth herein.

BACKGROUND OF THE INVENTION

1. Field of the Invention

The present invention relates to liquid crystal displays (LCDs). More particularly, the present invention relates to a backlight unit for a liquid crystal display module (LCM) incorporating a thermoelectric device.

2. Discussion of the Related Art

In general, notebook personal computers (NTPCs) and laptop computers are dimensionally compact, allowing users to access information stored thereon while on the move. NTPCs typically incorporate liquid crystal display (LCD) devices having LCD modules (LCMs). A typical LCM includes a liquid crystal (LC) panel and a driving circuit unit. The LC panel generally consists of two glass substrates having pixels arranged in matrix pattern and a plurality of switching elements for controlling signals supplied to the pixels. The driving circuit unit drives the LC panel by transmitting the controlling signals to the switching elements.

By itself, an LC panel does not emit light. Rather, LC panels selectively transmit light emitted from an external light source so as to display images. Such external light sources are usually provided as backlight units having a lamp.

FIG. 1 illustrates a cross-sectional view of a related art liquid crystal display module (LCM).

The related art LCM includes a main support 14, a liquid crystal (LC) panel 2 disposed within the main support 14, a top case 10 completely covering the main support 14 and partially covering an edge of the LC panel 2, a backlight unit disposed under the LC panel 2, and a bottom case 12 disposed under, and accommodating, the backlight unit. The main support 14 and the top case 10 are secured to each other by a screw (not shown).

The LC panel 2 typically includes two substrates separated by a liquid crystal layer (not shown). Upper and lower polarizers 42 and 40 are arranged on outwardly opposing surfaces of the two substrates, liquid crystal pixels are arranged in a matrix pattern between the two substrates, and thin film transistors (TFTs) are also provided in a matrix pattern to drive the liquid crystal pixels.

The top case 10 can be die-cast to have an L-shaped cross section and to cover a side of the main support 14 as well as the edge of the LC panel 2. The main support 14 is typically formed of a thermally conductive metal material such as aluminum (Al).

The backlight unit generally includes a lamp 20 that emits light, a lamp housing 16 having an opening and surrounding the lamp 20, a light guide plate 24, a reflector 26, and optical sheets 32, 34, and 36. The reflector 26 is disposed over the bottom case 12, the light guide plate 24 and optical sheets (i.e., diffusing sheet 32, a first prism sheet 34, and a second prism sheet 36) are sequentially disposed over the reflector 26, and the LC panel 2 is disposed over the optical sheets 32, 34, and 36 and is also surrounded by the main support 14. Although not shown, the upper side of light guide plate 24 is flat while the lower side of light guide plate 24 is tapered, enabling the light guide plate 24 to convert the light emitted by the lamp 20 from linear light into planar light. The lamp 20 and the lamp housing 16 are disposed at a side of the light guide plate 24 such that the opening of the lamp housing 16 is arranged adjacent to the side of the light guide plate 24. Accordingly, the backlight arrangement shown in FIG. 1 illustrates what is known as a side-type backlight arrangement.

The lamp 20 is typically provided as a cold cathode fluorescent lamp (CCFL) and includes electrodes formed at opposing ends thereof. Light emitted by the lamp 20 is reflected by the interior of the lamp housing 16, or is otherwise transmitted directly, through the opening of the lamp housing 16 to the light guide plate 24. The reflector 26 reflects light transmitted through the lower side of the light guide plate 24 back into the light guide plate 24 and through the upper side of the light guide plate 24 to reduce light loss of the backlight unit and to uniformly transmit toward the LC panel 2. Light transmitted through the upper side of the light guide plate 24 is evenly diffused by the diffusing sheet 32. The diffused light is then transmitted through the first and second prism sheets 34 and 36 and condensed within predetermined angles with respect to a normal line to the LC panel 2.

Constructed as described above, the related art LCM is commonly used within display devices of monitors, televisions, and display devices that are driven by high voltage and high currents. During operation, temperatures of electrodes at the opposing sides of the lamp 20 can reach about 200° C. Such high temperatures deleteriously damage components within the LCM near the electrodes (e.g., the light guide plate 24), thereby reducing the lifetime and reliability of the LCM.

SUMMARY OF THE INVENTION

Accordingly, the present invention is directed to a liquid crystal display (LCD) device including a backlight unit that substantially obviates one or more of the problems due to limitations and disadvantages of the related art.

An advantage of the present invention provides a liquid crystal display module (LCM) incorporating a thermoelectric device to convert heat emitted by a lamp into electricity.

Another advantage of the present invention provides an LCM incorporating a thermoelectric device having a reduced reliance on externally provided power.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an LCM according to a first embodiment may, for example, include a backlight unit having a lamp, wherein the lamp includes opposing ends and electrodes at respective ones of the opposing ends; at least one thermoelectric device operably proximate to the lamp; and a liquid crystal (LC) panel over the backlight unit.

In one aspect of the present invention, each thermoelectric device may, for example, include a hot junction disposed near the lamp; a cold junction spaced apart from the hot junction and disposed farther from the lamp than the hot junction; two different thermoelectric materials between the hot and cold junctions, wherein the two different thermoelectric materials are spaced from each other and wherein opposing ends of each of the different thermoelectric materials contact the hot and cold junctions; and first and second wires connected to respective ones of the two different thermoelectric materials.

According to principles of the present invention, an LCM may according to a second embodiment, for example, include a backlight unit having first and second lamps, wherein each lamp includes opposing ends and first and second electrodes at respective ones of the opposing ends; at least one thermoelectric device operably proximate between the first and second lamps; and an LC over the backlight unit.

In one aspect of the present invention, each thermoelectric device may, for example, include first and second hot junctions disposed near the first and second lamps, respectively, first and second cold junctions disposed between the first and second hot junctions and farther from the first and second lamps than respective ones of the first and second hot junctions; two different thermoelectric materials between the first hot and cold junctions and between the second hot and cold junctions, wherein the two different thermoelectric materials are spaced from each other and wherein opposing ends of each of the different thermoelectric materials contact the first and second hot and cold junctions; and first and second wires connected to respective ones of the two different thermoelectric materials.

According to principles of the present invention, an LCM may according to a third embodiment, for example, include a backlight unit having a plurality of lamps, wherein each lamp includes opposing ends and first and second electrodes at respective ones of the opposing ends; at least one thermoelectric device operatively proximate above or below each lamp; and an LC panel over the backlight unit, wherein the plurality of lamps are disposed directly under the LC panel.

In one aspect of the present invention, each thermoelectric device may, for example, include a hot junction disposed near the one of the first and second electrodes; a cold junction disposed farther from the one of the first and second electrodes than the hot junction; two different thermoelectric materials aligned along a major axis of the lamp between the hot and cold junctions, wherein the two different thermoelectric materials are spaced from each other and wherein opposing ends of each of the different thermoelectric materials contact the hot and cold junctions; and first and second wires connected to respective ones of the two different thermoelectric materials.

According to principles of the present invention, an LCM may, for example, include a backlight unit having at least one light emitting diode (LED); at least one thermoelectric device operably proximate to the at least one LED; and an LC panel over the backlight unit.

In one aspect of the present invention, each thermoelectric device may, for example, include a hot junction disposed near the LED; a cold junction spaced apart from the hot junction and disposed farther from the LED than the hot junction; two different thermoelectric materials between the hot and cold junctions, wherein the two different thermoelectric materials are spaced from each other and wherein opposing ends of each of the different thermoelectric materials contact the hot and cold junctions; and first and second wires connected to respective ones of the two different thermoelectric materials.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
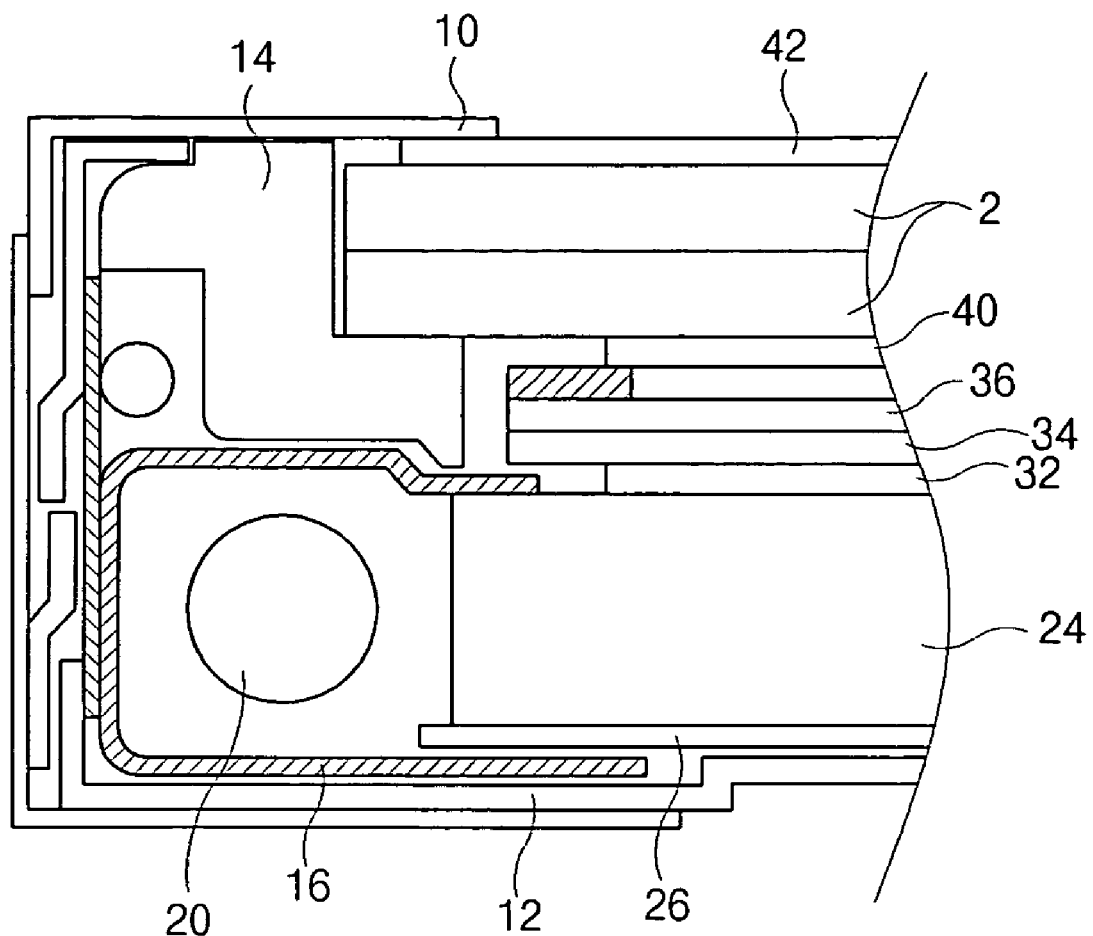
FIG. 1 illustrates a cross-sectional view of a related art liquid crystal display module (LCM)

Reference will now be made in detail to embodiments of the present invention, examples of which are illustrated in the accompanying drawings. Wherever possible, similar reference numbers will be used throughout the drawings to refer to the same or like parts. It is appreciated that the principles of the present invention may be extended to many types of display systems having backlight units, such as, but not limited to, the structure shown in FIG. 1. Accordingly, and for the sake of brevity, only that which is directly related to the principles of the present invention will be discussed with respect to the embodiments provided below.

Figure 2:
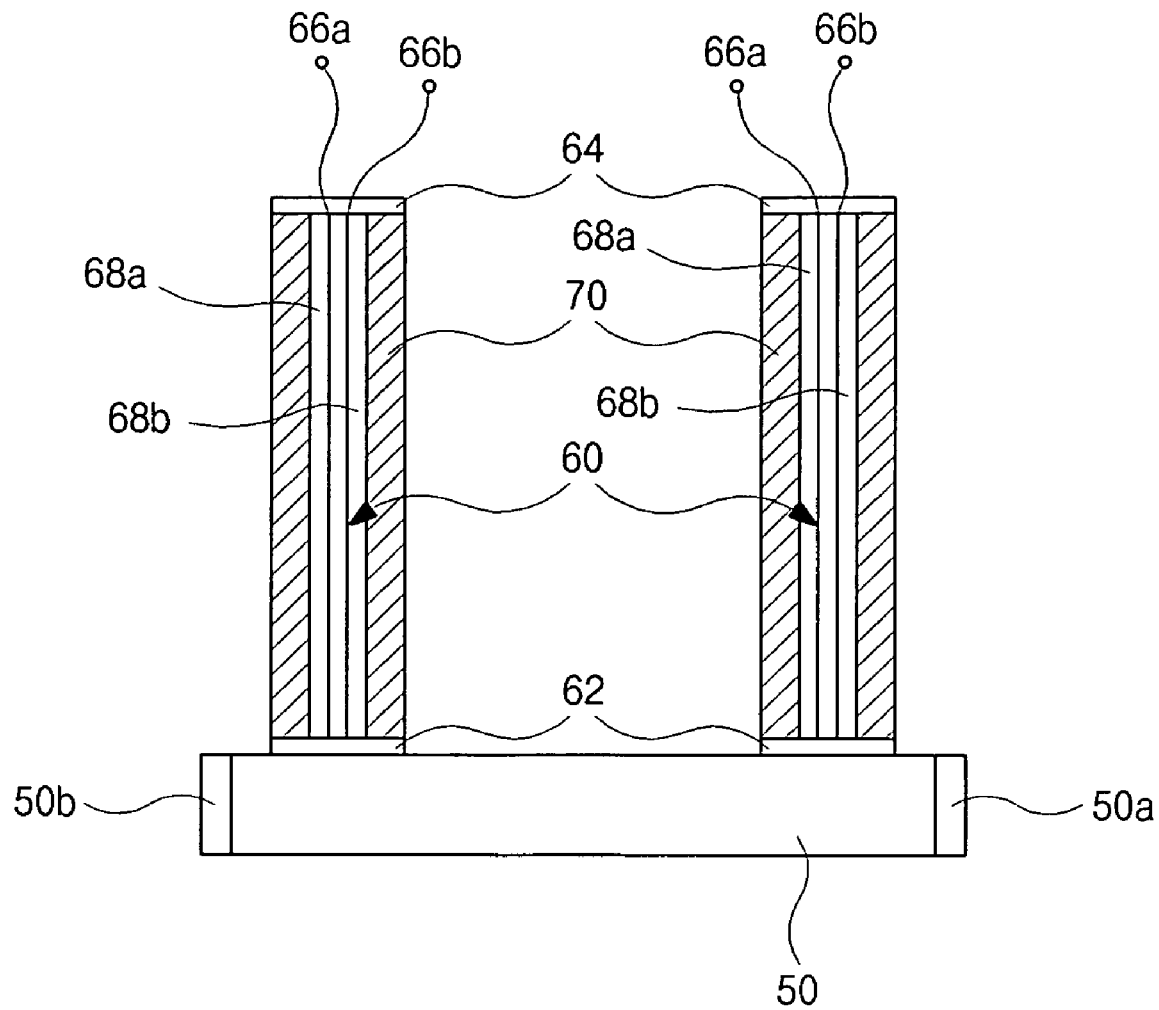
FIG. 2 illustrates an LCM incorporating a thermoelectric device according to a first embodiment of the present invention.

FIG. 2 illustrates a liquid crystal display module (LCM) incorporating a thermoelectric device according to a first embodiment of the present invention.

Referring to FIG. 2, the LCM of the first embodiment may include a lamp 50 and a plurality of thermoelectric devices 60 operably proximate to the lamp 50. When arranged operably proximate to the lamp 50, the thermoelectric devices 60 may convert any heat emitted therefrom into electricity. In one aspect of the present invention, the lamp 50 may, for example, be provided as cold cathode fluorescent lamp (CCFL) having opposing first and second ends and first and second electrodes 50a and 50b, respectively, formed at respective ones of the first and second ends. In another aspect of the present invention, respective ones of the thermoelectric devices 60 may be disposed operably proximate to the first and second electrodes 50a and 50b of lamp 50.

According to principles of the present invention, each of the thermoelectric devices 60 may, for example, include a hot junction 62, a cold junction 64, a first thermoelectric material 68a, a second thermoelectric material 68b different from the first thermoelectric material 68a, and adiabatic tape 70.

According to principles of the present invention, the hot junction 62 may be disposed near (e.g., within a first distance of), or contact, a predetermined one of the first or second electrodes 50a or 50b. In one aspect of the present invention, the cold junction 64 may be spaced apart from the hot junction 62 and be disposed farther from the predetermined one of the first or second electrodes 50a and 50b than the hot junction. That is, the cold junction 64 may be disposed at a second distance, greater than the first distance, from the predetermined one of the first and second electrodes 50a and 50b. In another aspect of the present invention, thermoelectric devices 60 may be arranged so as to minimally interfere with light emitted by the lamp 50 as it is transmitted to an LC panel of the LCM. For example, the cold junction 64 may be arranged in such a manner so as to be removed from an area where light is incident onto a light guide plate (not shown) of the backlight unit.

According to principles of the present invention, the first thermoelectric material 68a and a second thermoelectric material 68b are separated from each other but each include opposing ends that contact the hot and cold junctions 62 and 64. In one aspect of the present invention, the first and second thermoelectric materials 68a and 68b may comprise any suitable combination of metal and/or semiconductor-based materials (e.g., Al, Cu, Fe, BiSb, $Bi_2Te_3$, p-Te/Ag/Ge/Sb, $CeFe_{4-x}Co_xSb_{12}$, PbTe, SiGe, or the like, or combinations thereof).

According to principles of the present invention, the adiabatic tape 70 may cover portions of the thermoelectric device 62, including the first and second thermoelectric materials 68a and 68b, except for the hot and cold junctions 62 and 64, to substantially prevent a thermal flow between the interior and exterior of the thermoelectric device 60.

Lastly, first and second wires 66a and 66b may connect the first and second thermoelectric materials 68a and 68b, respectively, to desired electronic components of the LCM (e.g., the lamp 50, a driving circuit unit (not shown), or the like).

Figure 3:
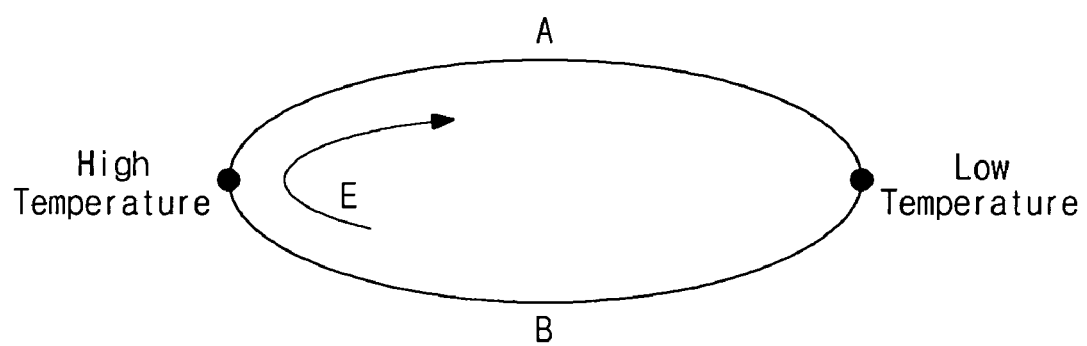
FIG. 3 conceptually illustrates an exemplary operation of the thermoelectric device according to principles of the present invention.

FIG. 3 conceptually illustrates an exemplary operation of the thermoelectric device according to principles of the present invention.

Referring to FIG. 3, the principles of the present invention involve the application of the Seebeck Effect: when a closed loop is formed by joining two different thermoelectric materials (e.g., first thermoelectric material A and second thermoelectric material B are arranged electrically in series and thermally in parallel), and the two junctions of the metals are at different temperatures, an electromotive force E (i.e., Seebeck voltage), is generated. The electromotive force E is proportional to the temperature difference between the hot and cold junctions and varies depending on the material properties (e.g., Seebeck coefficient, electrical conductivity, and thermal conductivity) of first and second thermoelectric materials A and B. Therefore, and referring back to FIG. 2, it is beneficial that the hot junctions 62 of thermoelectric devices 60 are as close as possible to the electrodes 50a and 50b. Accordingly, during operation of the lamp 50, the temperature at the hot junctions 62 near the electrodes 50a and 50b becomes greater than the temperature at the cold junctions 64 due to the relative proximity of the hot junctions 62 to the electrodes. As a result, the thermoelectric devices 60 may generate an electromotive force E that is transmitted to desired electronic components of the LCM via the first and second wires 66a and 66b, respectively.

Figure 4:
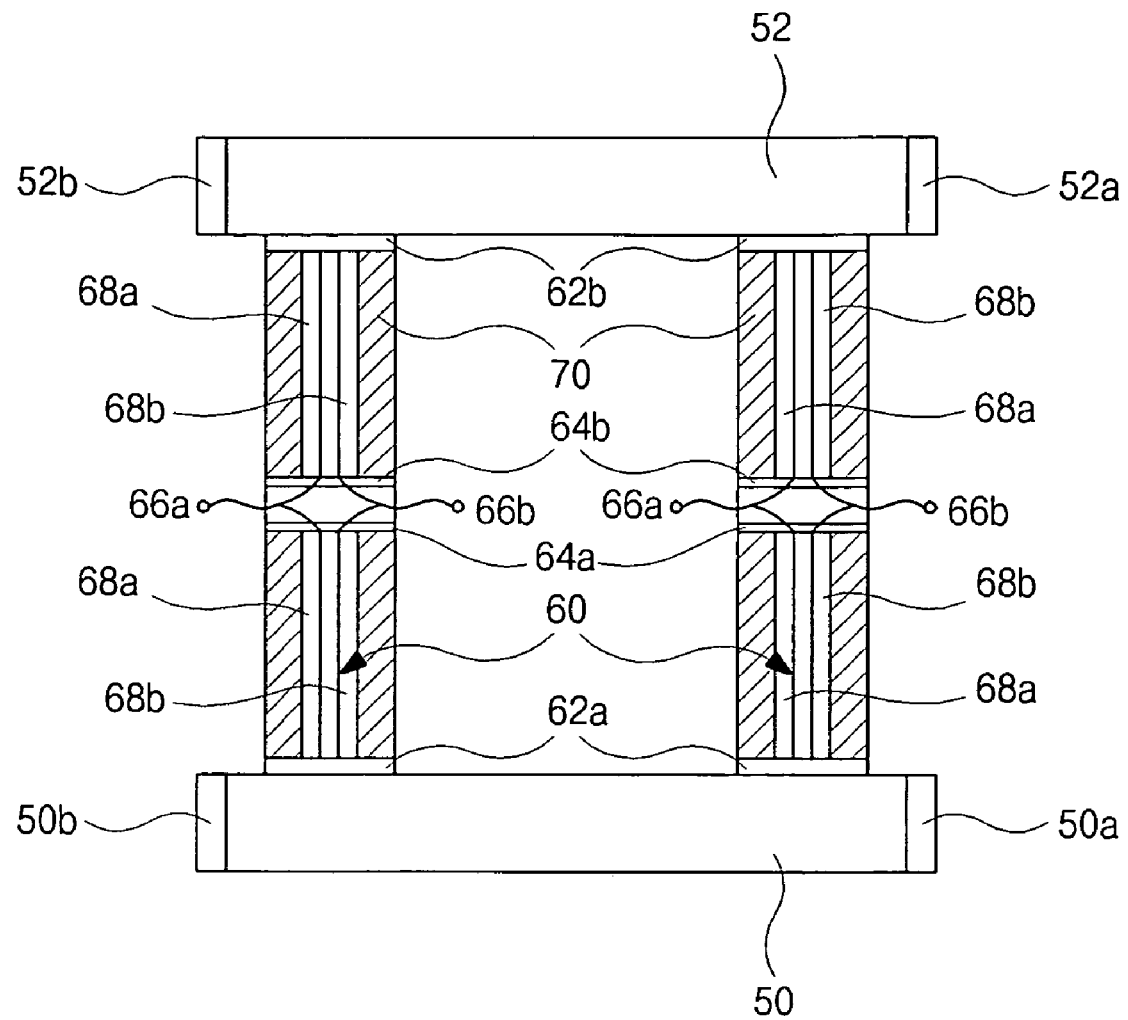
FIG. 4 illustrates an LCM incorporating a thermoelectric device according to a second embodiment of the present invention.

FIG. 4 illustrates an LCM incorporating a thermoelectric device according to a second embodiment of the present invention.

Referring to FIG. 4, the LCM of the second embodiment may include a plurality of lamps (e.g., first and second lamps 50 and 52, respectively) provided in a direct-type backlight unit. Accordingly, the plurality of lamps 50 and 52 may be spaced apart from, and parallel to, each other directly beneath an LC panel. According to the second embodiment, the LCM may further include a plurality of thermoelectric devices 60 operably proximate to the lamps 50 and 52. When arranged operably proximate to the lamps 50 and 52, the thermoelectric devices 60 may convert any heat emitted therefrom into electricity. In one aspect of the present invention, each of the lamps 50 and 52 may, for example, be provided as cold cathode fluorescent lamp (CCFL), light emitting diode (LED) or the like, or combinations thereof, having opposing first and second ends and first and second electrodes 50a, 50b, 52a, and 52b, formed at respective ones of the first and second ends. In another aspect of the present invention, the thermoelectric devices 60 may be disposed operably proximate between the lamps 50 and 52 and, beneficially, close to the electrodes 50a, 50b, 52a, and 52b.

According to principles of the present invention, each of the thermoelectric devices 60 may, for example, include first and second hot junctions 62a and 62b, first and second cold junctions 64a and 64b, between the first and second hot junctions 62a and 62b, first and second thermoelectric materials 68a and 68b, respectively, between each of the cold junctions 64a and 64b and its respective hot junction 62a and 62b, and adiabatic tape 70 surrounding the first and second thermoelectric materials 68a and 68b. Although FIG. 4 shows two adjacent cold junctions 64a and 64b between the first and second hot junctions 62a and 62b, those cold junctions 64a and 64b may be integrally formed as a single body.

According to principles of the present invention, each hot junction 62a and 62b may be disposed near (e.g. within a first distance of), or contact, a predetermined one of the electrodes 50a, 50b, 52a, and 52b. In one aspect of the present invention, each cold junction 64a and 64b may be spaced apart from its respective hot junction 62a and 62b and be disposed farther from a corresponding predetermined one of the electrodes 50a, 50b, 52a, and 52b than its respective hot junction 62a and 62b. Accordingly, during operation of the lamps 50 and 52, the temperature at the hot junctions 62a and 62b near the electrodes 50a, 50b, 52a, and 52b becomes greater than the temperature at the cold junctions 64a and 64b due to the relative proximity of the hot junctions 62a and 62b to the various electrodes. As a result, the thermoelectric devices 60 may generate an electromotive force E that is transmitted to desired electronic components of the LCM via the first and second wires 66a and 66b, respectively.

Figure 5:
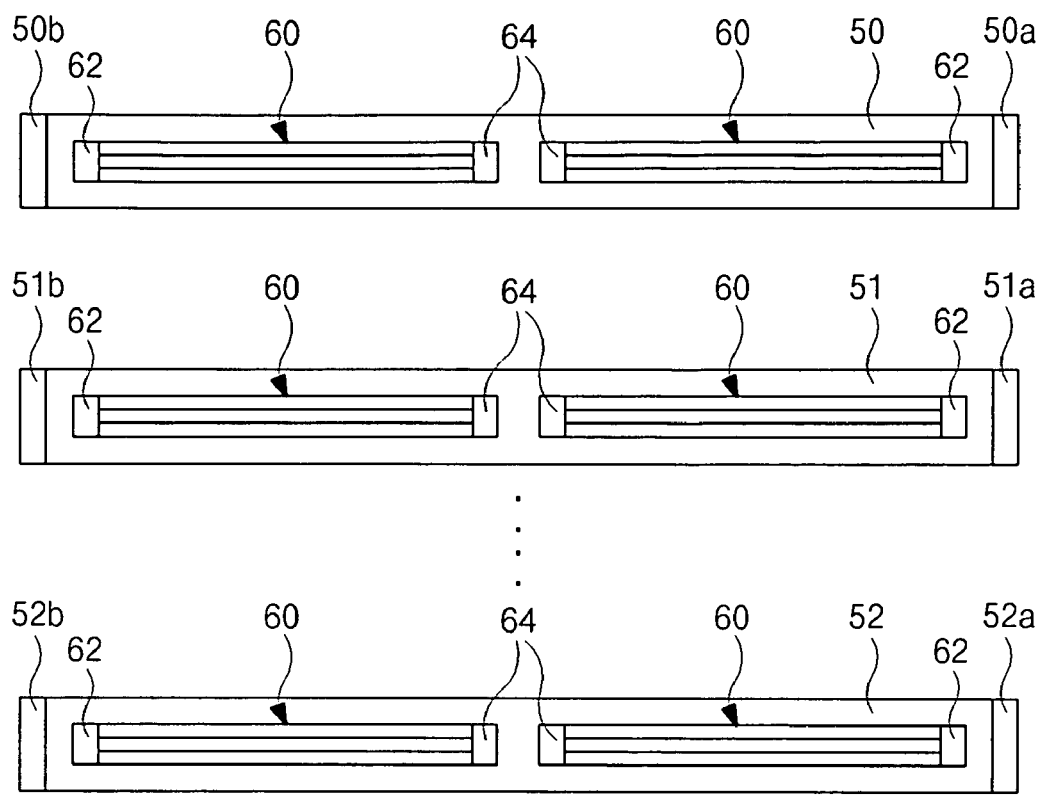
FIG. 5 illustrates an LCM incorporating a thermoelectric device according to a third embodiment of the present invention.

FIG. 5 illustrates an LCM incorporating a thermoelectric device according to a third embodiment of the present invention.

Referring to FIG. 5, the LCM of the third embodiment may include a plurality of lamps (e.g., first, second, and third lamps 50, 51 and 52, respectively) provided in a direct-type backlight unit. Accordingly, the plurality of lamps 50, 51, and 52 may be spaced apart from, and parallel to, each other beneath an LC panel. Due to the close proximity of the plurality of lamps 50, 51, and 52, it may be difficult to arrange the thermoelectric devices 60 between the lamps and obtain a large enough temperature difference between the hot and cold junctions 62 and 64 to generate a sufficient electromotive force E. Therefore, thermoelectric devices 60 of the present embodiment may be disposed above or below the plurality of lamps 50, 51, and 52 such that hot junctions 62 of each thermoelectric device 60 are near (e.g., within a first distance of), or contact, the first electrodes 50a, 51a, 52a of the first, second, and third lamps 50, 51, and 52, respectively, while the cold junctions 64 of each thermoelectric device 60 are arranged in middle portions of the first, second, and third lamps 50, 51, and 52, respectively. Accordingly, during operation of the lamps 50, 51, and 52, the temperature at the hot junctions 62 near the electrodes 50a, 50b, 51a, 51b, 52a, and 52b becomes greater than the temperature at the cold junctions 64 due to the relative proximity of the hot junctions 62 to the electrodes. For example, the temperature difference between the hot and cold junctions 62 and 64 illustrated in FIG. 5 can reach more than about 100° C.

Figure 6:
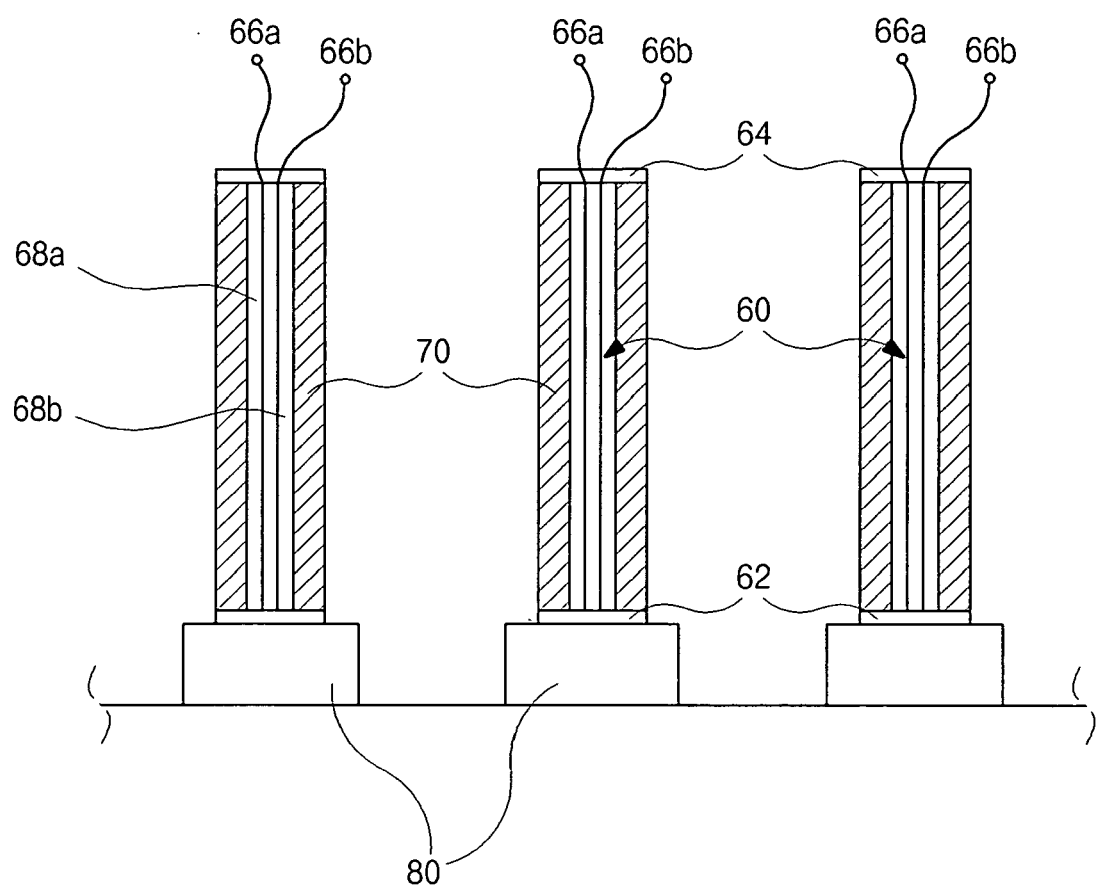
FIG. 6 illustrates an LCM incorporating a thermoelectric device according to a fourth embodiment of the present invention.

FIG. 6 illustrates an LCM incorporating a thermoelectric device according to a fourth embodiment of the present invention.

Referring to FIG. 6, the LCM of the fourth embodiment may include a plurality of LEDs 80. Accordingly, the LCM of the fourth embodiment be beneficially used applications where low weight and small size are important. According to principles of the present invention, a plurality of LEDs 80 may be spaced apart from each other and hot junctions 62 of each thermoelectric device 60 are arranged on (e.g., adhered to) each LED 80 such that respective cold junctions 64 are disposed away from each LED 80. Similar to the embodiments previously described, the thermoelectric device 60 shown in FIG. 6 may, for example, include first and second thermoelectric materials 68a and 68b and adiabatic tape 70 surrounding the different metals 68a and 68b to prevent thermal exchange.

As described in the first to fourth embodiments above, thermal energy emitted from a lamp is converted into electricity using thermoelectric devices. If the first and second wires 66a and 66b are connected to each other in parallel, a high current may be obtained by converting heat generated by the lamps into electricity. If, however, the first and second wires 66a and 66b are connected to each other in series, a high voltage may be obtained by converting heat generated by the lamps into electricity. The electricity gained from such a conversion may then be supplied to any of the components of the LCD device, thereby reducing reliance upon external power sources such as batteries.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a backlight unit including a lamp, wherein the lamp includes opposing ends and electrodes at respective ones of the opposing ends;
   a liquid crystal panel over the backlight unit; and
   at least one thermoelectric device operably proximate to the lamp, wherein at least one thermoelectric device includes:
      a hot junction disposed within a first distance of a portion of the lamp;
      a cold junction spaced apart from the hot junction and disposed farther from the portion of the lamp than the hot junction;
      first and second thermoelectric materials between the hot and cold junctions, wherein the first and second thermoelectric materials are spaced from each other and wherein opposing ends of each of the thermoelectric materials contact the hot and cold junctions, respectively; and
      first and second wires connected to the first and second thermoelectric materials, respectively.

2. The device according to claim 1, further including adiabatic tape surrounding the first and second thermoelectric materials.

3. The device according to claim 1, wherein the lamp is a cold cathode fluorescent lamp.

4. The device according to claim 1, wherein:
   the portion of the lamp includes a predetermined one of the electrodes; and
   the cold junction is disposed along a major axis of the lamp at a second distance from the predetermined one of the electrodes, wherein the second distance is greater than the first distance.

5. The device according to claim 1, further including a driving circuit connected to the liquid crystal panel, wherein the first and second wires are electrically connected between the at least one thermoelectric device and the driving circuit.

6. A liquid crystal display device, comprising
   a backlight unit including first and second lamps, wherein each lamp includes opposing ends and electrodes at respective ones of the opposing ends;
   a liquid crystal panel over the backlight unit; and
   at least one thermoelectric device operably proximate between the first and second lamps, wherein at least one thermoelectric device includes:
      first and second hot junctions within a first distance of portions of the first and second lamps, respectively;
      first and second cold junctions spaced apart from respective ones of the first and second hot junctions and disposed farther from the portions of the first and second lamps;
      first and second thermoelectric materials between each of the first hot and cold junctions and the second hot and cold junctions, wherein the first and second thermoelectric materials are spaced from each other and wherein opposing ends of each of the thermoelectric materials contact the hot and cold junctions, respectively; and
      first and second wires connected to the first and second thermoelectric materials, respectively.

7. The device according to claim 6, further comprising a adiabatic tape surrounding the first and second thermoelectric materials so as to prevent thermal exchange between an interior of the thermoelectric device and an exterior of the thermoelectric device.

8. The device according to claim 6, wherein each lamp is a cold cathode fluorescent lamp.

9. The device according to claim 6, wherein:
   the portions of the first and second lamps include predetermined electrodes of respective ones of the first and second lamps; and
   the first and second cold junctions are disposed between the first and second hot junctions.

10. The device according to claim 6, further including a driving circuit connected to the liquid crystal panel, wherein the first and second wires are electrically connected between the at least one thermoelectric device and the driving circuit.

11. The device according to claim 6, wherein the first and second cold junctions are integrally formed as a single body.

12. A liquid crystal display device, comprising
   a backlight unit including a plurality of lamps, wherein each lamp includes opposing ends and electrodes at respective ones of the opposing ends;
   a liquid crystal panel over the backlight unit, wherein the plurality of lamps are disposed directly under the liquid crystal panel; and at least one thermoelectric device operably proximate to the lamps, wherein each thermoelectric device includes:
- a hot junction disposed within a first distance of a portion of one of the plurality of lamps;
- a cold junction disposed along a major axis of the one of the plurality of lamps at a second distance from the portion of one of the plurality of lamps, wherein the second distance is greater than the first distance;
- first and second thermoelectric materials aligned along a major axis of the lamp between the hot and cold junctions, wherein the first and second thermoelectric materials are spaced apart from each other and wherein opposing ends of each of the thermoelectric materials contact the hot and cold junctions; and
- first and second wires connected to the first and second thermoelectric materials, respectively.

13. The device according to claim 12, wherein each lamp is a cold cathode fluorescent lamp.

14. The device according to claim 12, wherein at least one thermoelectric device is above at least one of the plurality of lamps.

15. The device according to claim 12, wherein at least one thermoelectric device is below at least one of the plurality of lamps.

16. The device according to claim 12, further including a driving circuit connected to the liquid crystal panel, wherein the first and second wires are electrically connected between the at least one thermoelectric device and the driving circuit.

17. The device according to claim 12, wherein the first and second wires are connected to each other in parallel.

18. The device according to claim 12, wherein the first and second wires are connected to each other in series.

19. A liquid crystal display device, comprising
a backlight unit including a light emitting diode (LED);
a liquid crystal panel over the backlight unit; and
at least one thermoelectric device operably proximate to the LED, wherein at least one thermoelectric device includes:
- a hot junction disposed within a first distance of a portion of the LED;
- a cold junction spaced apart from the hot junction and disposed farther from the portion of the LED than the hot junction;
- first and second thermoelectric materials between the hot and cold junctions, wherein the first and second thermoelectric materials are spaced from each other and wherein opposing ends of each of the thermoelectric materials contact the hot and cold junctions, respectively; and
- first and second wires connected to the first and second thermoelectric materials, respectively.

20. The device according to claim 19, further including adiabatic tape surrounding the first and second thermoelectric materials.

21. The device according to claim 19, further including a driving circuit connected to the liquid crystal panel, wherein the first and second wires are electrically connected between the at least one thermoelectric device and the driving circuit.

22. An active display device, comprising:
at least one light emitting device;
a driving circuit controlling an operation of the active display device; and
at least one thermoelectric device operably proximate to the at least one light emitting device, wherein at least one thermoelectric device includes:
- a hot junction disposed within a first distance of a heat generating portion of the light emitting device;
- a cold junction spaced apart from the hot junction and disposed farther from the heat generating portion of the light emitting device than the hot junction;
- first and second thermoelectric materials between the hot and cold junctions, wherein the first and second thermoelectric materials are spaced from each other and wherein opposing ends of each of the thermoelectric materials contact the hot and cold junctions, respectively; and
- first and second wires electrically connected between the first and second thermoelectric materials, respectively, and the driving circuit.

* * * * *